United States Patent
Gambino et al.

[11] Patent Number: 6,136,686
[45] Date of Patent: Oct. 24, 2000

[54] FABRICATION OF INTERCONNECTS WITH TWO DIFFERENT THICKNESSES

[75] Inventors: Jeffrey P. Gambino, Gaylordsville, Conn.; Mark Jaso, Manassas, Va.; Hing Wong, Mountain View, Calif.

[73] Assignee: International Business Machines Corporation, Armonk, N.Y.

[21] Appl. No.: 08/897,172

[22] Filed: Jul. 18, 1997

[51] Int. Cl.[7] .............................................. H01L 21/4763
[52] U.S. Cl. .......................... 438/624; 438/638; 438/668; 438/783
[58] Field of Search ................... 438/618, 620, 438/624, 637, 634, 638, 712, 735, 783, 705, 911, 407, 924, 666, 668

[56] References Cited

U.S. PATENT DOCUMENTS

| | | | |
|---|---|---|---|
| 5,111,276 | 5/1992 | Hinharh et al. | 257/691 |
| 5,166,088 | 11/1992 | Ueda et al. | 438/47 |
| 5,182,629 | 1/1993 | Nowak et al. | 257/577 |
| 5,370,766 | 12/1994 | Desaigoudar et al. | 216/13 |
| 5,404,046 | 4/1995 | Matsumoto et al. | 257/750 |
| 5,422,839 | 6/1995 | Ishibashi et al. | 365/51 |
| 5,466,639 | 11/1995 | Ireland | 438/195 |
| 5,502,335 | 3/1996 | Oda | 257/751 |
| 5,552,342 | 9/1996 | Itou et al. | 438/195 |
| 5,681,780 | 10/1997 | Mihara et al. | 438/228 |
| 5,741,741 | 4/1998 | Tseng | 438/637 |
| 5,811,357 | 9/1998 | Armacost et al. | 438/723 |

OTHER PUBLICATIONS

T. Sakae & W. Yoshiaki, Thin–Film Transistor Array, Sep. 22, 1989, Japan (Kokai) 6–46279.

I. Hirofumi, Semiconductor Device, Apr. 21, 1995, Japan (Kokai) 7–106324.

*Primary Examiner*—Wael Fahmy
*Assistant Examiner*—Kurt Eaton
*Attorney, Agent, or Firm*—Whitham, Curtis & Whitham; Daryl K. Neff, Esq.

[57] ABSTRACT

Provision of differential etching of layers by, for example, an etch stop layer or implantation, allows a second trough etch to be performed in accordance with a block-out mask (which does not require high accuracy of registration) to provide troughs or recesses of different depths in layers of insulator. When the recesses or troughs are filled by metal deposition and patterned by planarization in accordance with damascene processing, structurally robust conductors of differing thicknesses may be achieved and optimized to enhance noise immunity and/or signal propagation speed in different functional regions of an integrated circuit such as the so-called array and support portions of a dynamic random access memory.

17 Claims, 4 Drawing Sheets

FABRICATION OF INTERCONNECTS WITH TWO DIFFERENT THICKNESSES

BACKGROUND OF THE INVENTION

1. Field of the Invention

The present invention generally relates to integrated circuit devices formed at high integration density and, more particularly, to formation of circuits which may have widely varying current-carrying, signal propagation time and noise immunity requirements for respective circuits and/or subsystems which may be included therein such as in dynamic random access memories (DRAMs).

2. Description of the Prior Art

Manufacture and design of integrated circuits has greatly increased in sophistication in recent years, particularly in regard to increase of integration density. Increased integration density leads to economic advantages as increased numbers of devices and circuits may be placed on a single chip and/or within a single package (which may include a plurality of chips). Performance improvements such as reduced signal propagation time and noise immunity can usually be achieved as integration density is increased due to reduction in length of signal paths, capacitance between connections and the like. This performance gain is particularly important in integrated circuits.

Integrated circuits such as dynamic random access memories (DRAMs) can have millions of similar devices on a single chip (often collectively referred to as an array or array portion of the chip design) which are controlled throughout the chip or partitions thereof by circuits such as addressing circuits, sense amplifiers and the like, generally referred to as support circuits. Unfortunately, the circuit requirements are generally different for the array and support regions of the chip and hence ideally would require different processes during manufacture.

For example, the word lines or bit lines in a functional region of the integrated circuit such as an array portion of a memory need not carry large currents but run generally parallel to each other at close spacing and cannot generally be reduced in length for a given chip or partitioning; leading to noise through capacitive coupling between them. Therefore, very thin conductors are preferred to minimize areas of the word lines opposed to each other and resulting capacitive coupling. In contrast, the conductors of another functional portion such as the support portion of the integrated circuit device may require greater current-carrying capability but may be of reduced length while switching speed may be more critical. Therefore, it is preferred to increase the thickness of such conductors in order to reduce resistance and RC time constant signal propagation delays. However, these conductors are often in the same metal level and the use of separate processes for their fabrication is complicated by at least required masking beyond the procedures involved in the plural separate processes themselves.

Therefore, such differences in conductor thickness are not trivial to obtain. Previously proposed methods add complexity to lithographic and other manufacturing processes and can adversely affect manufacturing yield. For example, narrow connections at fine pitch are often formed by so-called damascene processes in which recesses or troughs are lithographically patterned and etched into a surface and filled by deposition of a layer of conductive material such as metal over the entire surface. Planarization (e.g. by chemical-mechanical polishing (CMP)) after filling provides separation and patterning of the conductors while they are laterally supported and insulated from each other by the material defining the groove or recess. The resulting surface is also planar and thus does not complicate further lithographic processes.

While this process provides high manufacturing yield of highly robust conductor structures of a single thickness corresponding to the trough depth, different conductor depths require two or more masking and etching steps very accurately registered with each other, as disclosed in Hirofumi, Japanese Patent Application 93-242835. Registration of these steps is very difficult and expensive and very slight misregistration can greatly compromise manufacturing yield and/or circuit performance. If conductors of different cross-sectional areas are fabricated with a single thickness (e.g. either a single mask damascene process of patterned surface deposition), the width necessary to significantly reduce resistance would increase capacitance due to the increased area, limiting the gains in signal propagation speed from decreased resistance and, perhaps more importantly, would require increased chip area such that currently available lithographic processes cannot be fully exploited to increase array density and device counts. In other words, conductor width in the support region may require exceeding the device pitch in the array region to obtain discernable performance gains.

Such difficulties are not limited to damascene processes. Surface deposition and patterning yields conductors which are much less robust and uniform and which may become even more delicate and subject to shorting and metal migration (which tends to open connections in a largely unpredictable manner) if height of the conductors is increased. A second masking operation with similarly high registration accuracy (as disclosed in Nowak et al., U.S. Pat. No. 5,182,629) or selective etchback to form thin conductors using an etch stop within the connector (as disclosed in Hingarth et al., U.S. Pat. No. 5,111,276) would be necessary in any event to provide height differences. The surface connections so formed are particularly vulnerable to damage during mask or resist removal or other required processing. Further, surface conductors of differing height present severe surface topology which may complicate or compromise subsequent lithographic processes (e.g. exposure focus).

Accordingly, there is no previously known process for forming wiring of different thicknesses in a single level of a semiconductor device without greatly increasing process complexity and cost or compromising manufacturing yield, while allowing full exploitation of current skill in the lithographic art to provide increased integration density and circuit performance.

SUMMARY OF THE INVENTION

It is therefore an object of the present invention to provide a technique of forming conductors of different thicknesses in a single level of an integrated circuit device.

It is another object of the invention to provide a damascene process which can provide conductors of differing thicknesses without being compromised or complicated by stringent requirements for registration of plural masks.

It is a further object of the invention to provide a structure for an integrated circuit device in which conductor dimensions may be optimized in the array and support regions thereof for noise immunity and increased signal propagation speed.

In order to accomplish these and other objects of the invention, a method of fabricating an integrated circuit device having an first functional region and a second functional region is provided including the steps of selectively etching areas of an insulator structure to form recesses, providing for differential etching of areas of the insulator structure corresponding to the areas selectively etched, block-out masking one of the first and second functional portions of said integrated circuit device, differentially etching an area of the insulator structure to form a recess therein in registration with recesses in the insulator structure formed by the selectively etching step, and applying metal in the recesses in the insulator structure.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
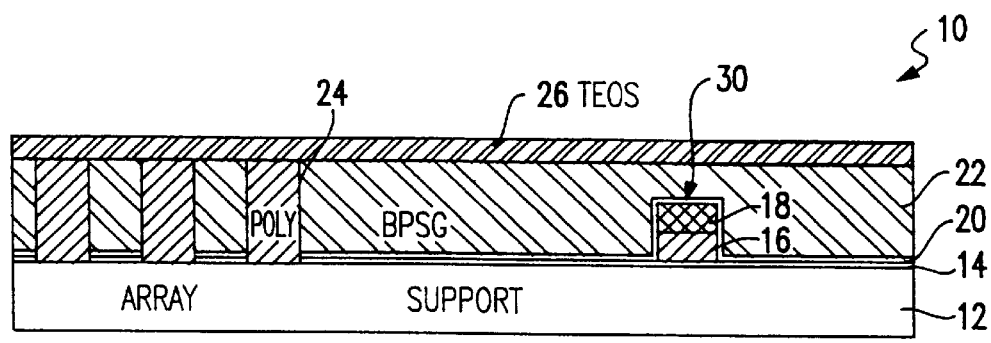
FIGS. 1, 2 and 3 illustrate, in cross-section, a known general methodology for producing array and support sections of an exemplary dynamic random access memory (DRAM) including a contact implant.
Figure 3:
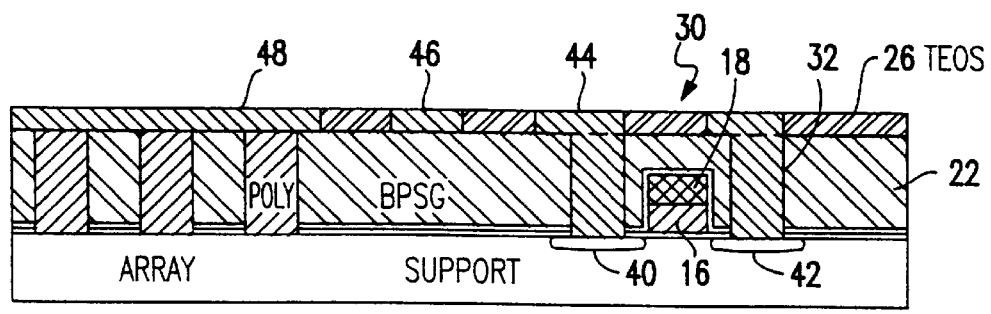
Figure 4:
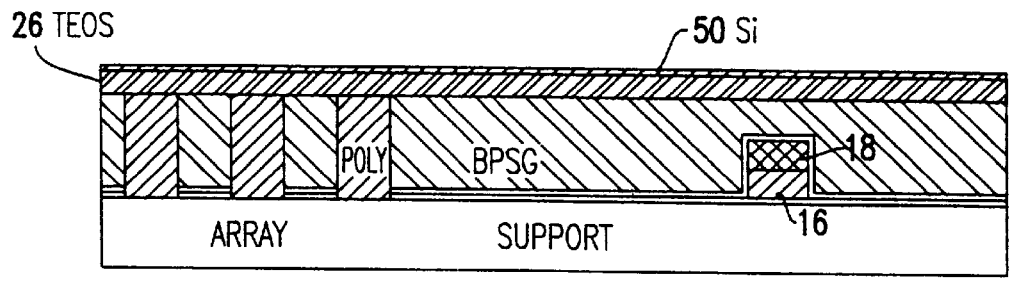
FIGS. 4, 5 and 6 illustrate, in cross-section, a first methodology for producing a preferred form of the invention using a dry etch process.
Figure 7:
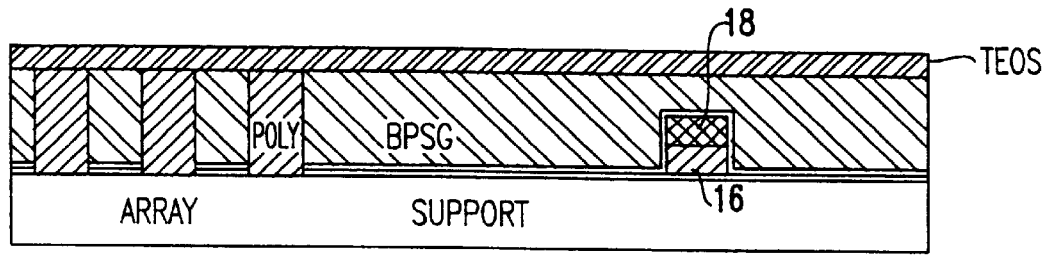
FIGS. 7, 8 and 9 illustrate, in cross-section, a second methodology for producing a preferred form of the invention using a wet etch process, and FIG. 10 graphically depicts different etch rates for preferred materials and implant species for practice of the invention.

Referring now to the drawings, and more particularly to FIGS. 1, 4 and 7, there is shown, in cross-section, a partially completed portion 10 of a structure of an exemplary dynamic random access memory (DRAM) in a region including a boundary (generally depicted at 52) between an array portion or region including a large plurality of storage cells and a support portion or region including addressing circuits, decoders, sense amplifiers and the like in which only a single exemplary field effect transistor 30 is shown for clarity. It should be understood that these illustrations and the portions of structure repeated in the remainder of the Figures is generalized in the interest of clarity and details not important to the practice of the invention are thus omitted. Accordingly, while FIGS. 1–3 are illustrative of structure over which the present invention provides an improvement, no portion of any Figure is admitted to be prior art as to the present invention.

The structures of FIGS. 1, 4 and 7 all include a substrate 12 of semiconductor material such as silicon, germanium or other semiconductor material (silicon being assumed as exemplary for the remainder of the discussion of the invention) covered by a thin blanket layer 14 of oxide or other insulator which forms the gate insulator of field effect transistor 30. It should be understood that other structures which are not illustrated, such as trench capacitors could already have been formed in or on the substrate 12 and that substrate 12, as depicted could represent a doped well or a layer on yet another substrate (not illustrated) as the design of the integrated circuit may require.

Gates 16 of transistors 30 are preferably formed by deposition and patterning of a layer of doped polysilicon overlaid by a layer of silicon nitride 18. The gates are patterned by standard lithography and etch techniques (e.g. reactive ion etching). A series of implants are performed with appropriate block-out masks to form diffusions in the array region and source/drain junctions 40, 42 of the support region. A further thin nitride layer 20 is applied over the layered gate structures 16, 18 to function as an etch stop and diffusion barrier during further processing.

Figure 2:
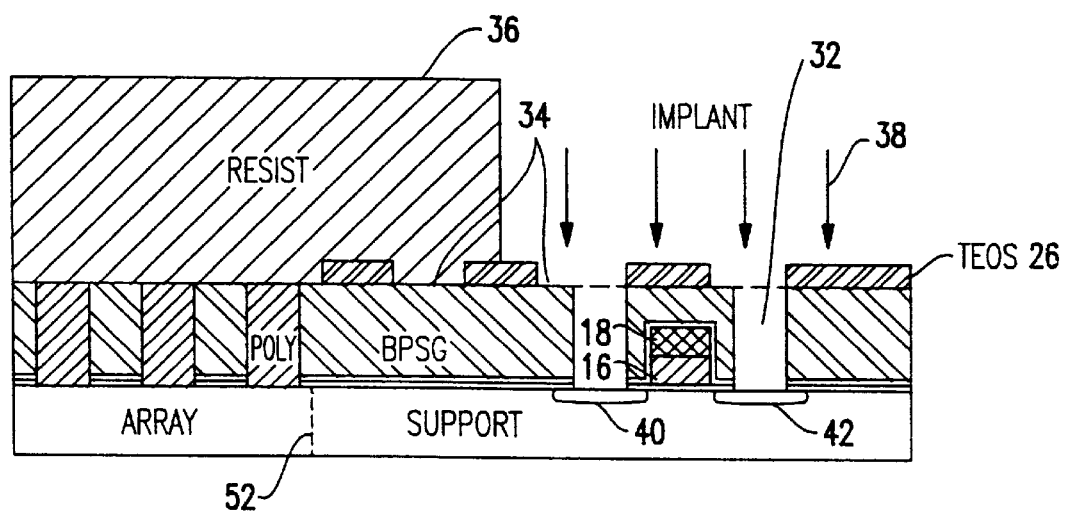

Referring now to FIG. 2, a relatively thick layer 22 of borophosphosilicate glass (BPSG) is then deposited by any known technique (e.g. spin-on glass (SOG), low pressure chemical vapor deposition (LPCVD) and the like) and planarized, preferably by chemical-mechanical polishing (CMP). The BPSG layer 22 and layers 14, 20 are then patterned in the array portion thereof (and elsewhere as may be required by the design) to substrate 12 and polysilicon studs 24 formed as contacts to structures formed in or on the array region of the substrate 12. A tetra-ethyl orthosilicate (TEOS) layer 26 is then deposited to serve as a dielectric for the first metal level. It should also be understood that, in accordance with the principles of the invention, the BPSG layer 22 and TEOS layer 26 form a preferred, exemplary insulator structure that could comprise more or fewer layers. However, it is preferred to provide different insulator materials in at least two differentially etchable layers to facilitate regulation of the depth of the first trough etch, to optimize gap fill around the gates and/or to provide a good polish stop during metal planarization by CMP.

Apertures 32 are then formed for contacts in the support portion of the device by etching or other appropriate processes and the TEOS layer 26 is patterned as shown at 34 for formation of conductors (extending into and out of the page) by a damascene process. The TEOS layer is removed or patterned (for example, to form a connector in the plane of the page) in a first trough etch process over the array portion of the device. A resist layer 36 is then formed over the array area and a contact implant (so-called because of its use to form ohmic contact regions of the transistor) is performed (generally at a much higher dose than for forming the source/drain regions 40, 42) as indicated by arrows 38 to reduce the resistance of the contacts. The contacts are then annealed to activate the dopants and repair implant damage. Then resist 36 is removed and metal deposited in a blanket layer over the full surface of the device. Planarization of the metal, preferably by CMP then patterns the metal layer to form conductors 44, 46 and 48 as well as filling apertures 32 to form source and drain contacts of transistor 30, as shown in FIG. 3. Array connections 48 may be further patterned as may be necessary to the device design.

It is important to note from the foregoing that conductors 44 (above the contacts formed in apertures 32), 46 and 48 are all of the same thickness as defined by the damascene process in TEOS layer 26. Further, it is important to an appreciation of the meritorious effects of the invention that resist 36 is essentially a block-out mask which can be applied without extreme accuracy of registration and is required for a contact implant. In this regard, implantation in the exposed regions of the BPSG layer 22 occurs to only a minimal degree if at all and, in any event, does not affect the insulating properties of the BPSG layer to any significant degree. If considered critical, the implant could also be performed prior to opening the TEOS layer other than at connection apertures 32 in BPSG layer 22.

Figure 5:
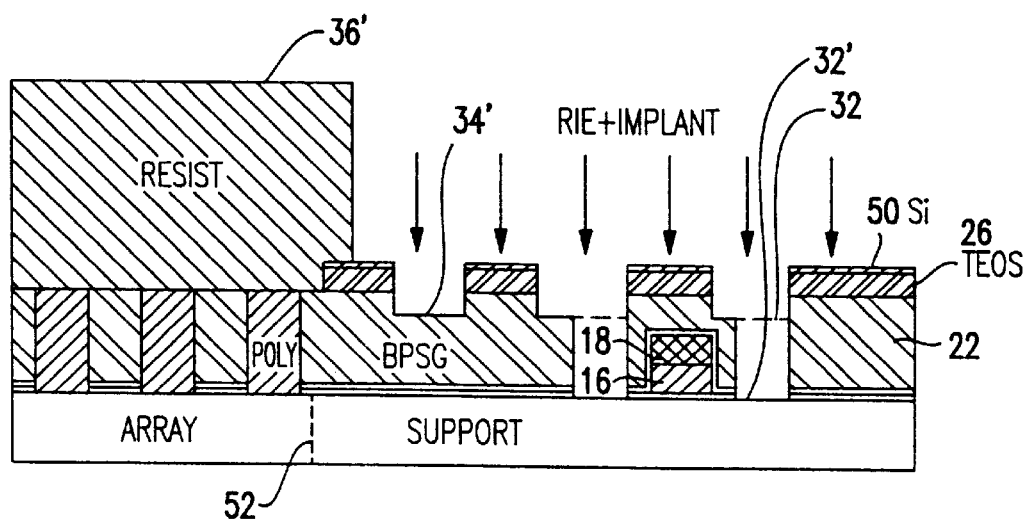
Figure 6:
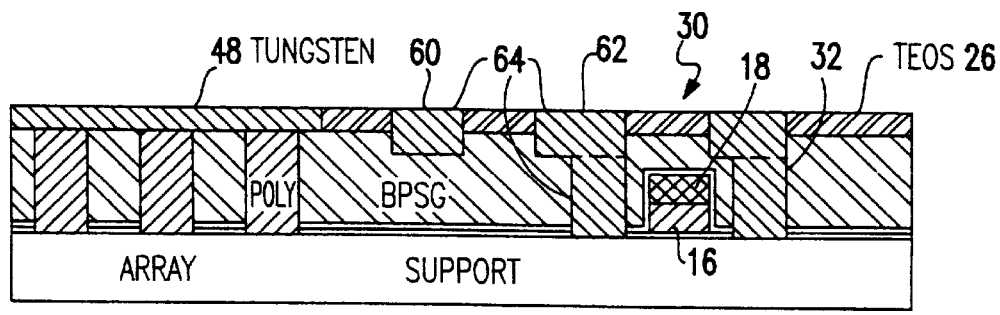

Referring now to FIGS. 4–6, a first methodology for carrying out the invention to produce conductors of different thicknesses will now be discussed. The structure of FIG. 4 differs from that of FIG. 1 only in the inclusion of a thin (e.g. 5–20 nm) layer 50 of silicon or other material to serve as an etch stop during a second trough etch as will be described below subsequent to patterning of TEOS layer 26 in a first trough etch process. Such an etch stop essentially provides for differential etching between areas of underlying layers which are exposed by the etch stop and apertures in layers with which such areas are in registration. Differential etch rates can be achieved in other ways, as well, as will be discussed below in regard to FIGS. 7–9.

In FIG. 5, the first trough etch of the TEOS layer has been completed and block-out mask 36' applied. Mask 36' corresponds to implant mask 36 of FIG. 2 but the edge thereof is formed to correspond to the boundary between the array and support sections of the device (as indicated by dashed line 52 in FIGS. 1 and 4) rather than the general boundary of the region at which the implantation is required. It should be noted in this regard that connector 60 (FIG. 6) may form a contact to other transistors similar to transistor 30 but which are located in front of or behind the plane of the page of FIG. 5. Therefore, it should be appreciated that the edge of mask 36 of FIG. 2 may, in practice, be substantially aligned with boundary 52 in the same location as shown for mask 36' of FIG. 5 (and FIG. 8) and does not necessarily represent a substantive difference between the devices or processes depicted. As alluded to above, the implantation has no significant effect on the insulative properties of the BPSG layer 22 and, if a contact implantation is required in the manufacturing process of the chip design (as would generally be the case if FETs are employed in the support section of the device) mask 36' can be considered as a "free mask" for purposes of the invention since it is required in the same or only slightly different location in the formation of other structures in the design.

As shown in FIG. 5, a reactive ion etch (RIE) is carried out in accordance with mask 36' as the second trough etch referred to above. Details of the RIE process are well-understood and familiar to those skilled in the art and are not critical to the practice of the invention. It should be noted, however, that the process is chosen to selectively provide negligible, if any, etching at the bottoms 32' of apertures 32 while etching the BPSG. It should also be noted that the sequence of implantation (and details thereof, such as energy and implanted species) and etching (and annealing after implantation) may or may not be important to the etching which occurs, as will be evident to those skilled in the art in view of the discussion thereof with reference to FIGS. 7–10. For that reason, if a silicon substrate 12 is employed, a silicon etch stop layer 50 is preferred to allow maximum process simplicity and latitude. This second trough etch thus increases the depth of recesses 34 (FIG. 2) beyond TEOS layer 26 and into the BPSG layer 22, as shown at 34' in accordance with mask 36'.

To complete this first process in accordance with the invention, metal 64, such as tungsten, titanium or titanium nitride or alloys thereof is then deposited and patterned by CMP (preferably to remove silicon layer 50, as well, which may require alteration of polishing slurry composition) in accordance with damascene processing methodology but results in a greater depth of conductors in the support region of the device (e.g. at 60, 62) than in the array region of the device (e.g. at 48), as may be seen in FIG. 6. Connection apertures 32 are filled by the same process. It should be noted that the formation of conductors of different thicknesses has been accomplished in a single metallization and CMP process requiring only the use of a block-out mask (which does not require precise registration) 36' which would be required for a contact implantation process in the manner of mask 36 of FIG. 2, if required by the device design, provision and later removal of an etch stop layer 50 and a second trough etch process which does not require formation of etch stops at intermediate depths in the conductor to achieve different thicknesses (as required in previously known processes, as discussed above).

Figure 8:
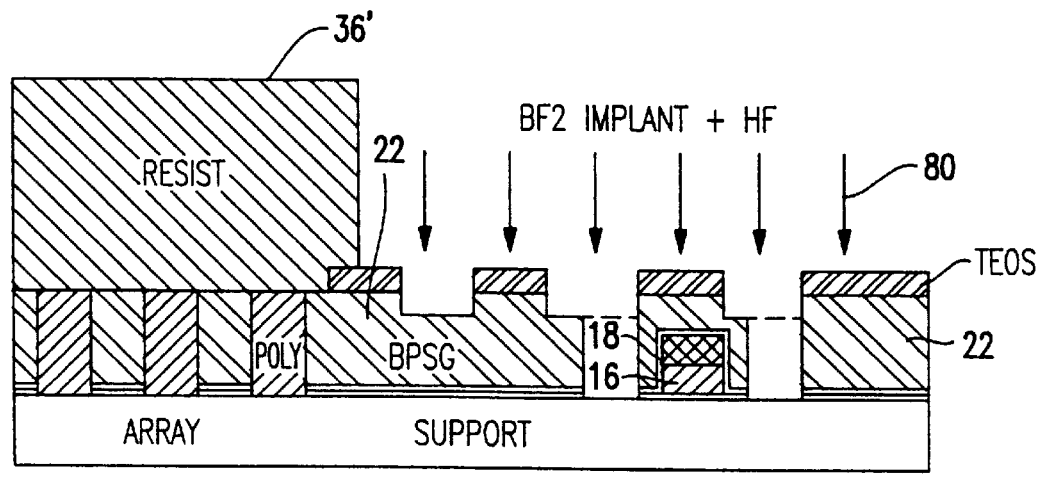
Figure 9:
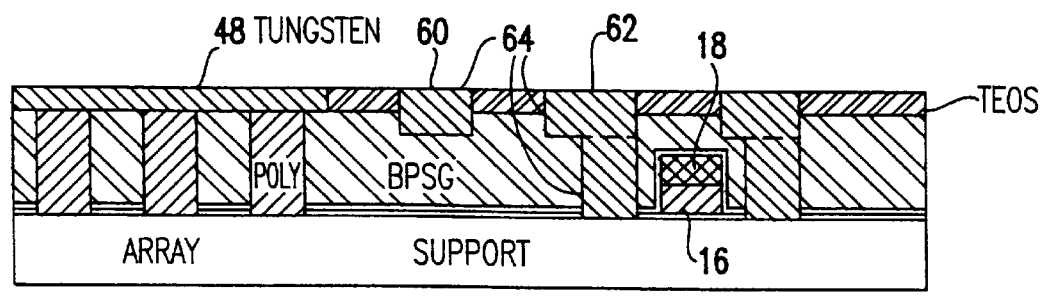

Referring now to FIGS. 7–9, a second process for forming conductors of two thicknesses in a single metallization and planarization process will be discussed. By way of contrast, the methodology of FIGS. 4–6 employs a so-called dry etch process of which RIE is exemplary whereas FIGS. 7–9 employ a so-called wet etch. It is to be understood that etch processes alternative to those discussed as being preferred can also be employed within the principles of the invention and an etch stop 50 layer could be provided if an etchant other than that preferred for the wet etch process is employed, as will be discussed below.

The structure depicted in FIG. 7 is precisely the same as that depicted in FIG. 1. Subsequent to a first trough etch as described above in regard to FIG. 5, a block-out resist mask 36' is applied as described above to expose regions, such as the support region, where thick interconnects are desired. These regions are then exposed to a contact implant, as indicated by arrows 80, preferably using $BF_2$ or arsenic (As) as a dopant. The resist is then preferably stripped (although it could be left in place) and the device exposed to a hydrofluoric acid (HF) second trough etch either in a bath or plasma reactor or the like. In this case, the implantation process details (e.g. dose, species, energy) may be chosen to result in significant implantation in the BPSG layer 22 and the HF etch proceeds significantly faster in implanted BPSG than with implanted undoped oxide or unimplanted BPSG. It should be noted that while implantation in the BPSG layer 22 is significant, it does not affect insulating properties (particularly in the final structure since implanted regions will be substantially etched away) but is intended to significantly alter etch rate of the insulator structure.

This differential etch rate may also allow practice of the invention under certain circumstances using only a single etch step if thickness of the TEOS layer 26 is properly accounted for. As is known, differential etching rates are occasioned by both atomic displacements in the solid due to the implanted species as well as the chemistry of the implanted species in relation to the material in which they are implanted. Therefore, adjustment of implantation species, dose and energy, etchant concentration and resulting etch rates in different materials will be apparent to those skilled in the art in view of this discussion, whether the trough etching is carried out in one step or two.

In this regard, it should be noted that this wet etch process for practice of the invention requires implantation prior to etching for the particular preferred materials. In contrast, the order of implantation and etching may be irrelevant or important, depending on etchants and materials in the methodology discussed in regard to the dry etch process of FIGS. 4–6 or essentially unimportant with other etchants in other suitable wet etch processes as will be evident to those skilled in the art in view of this discussion of the invention.

By the same token, in regard to the preferred wet etch process using HF, the respective etch rates are also affected by the implanted species and the implant/annealing sequence. If the etch is done before annealing, a greater etch rate of the implanted BPSG will be achieved with heavier species such as arsenic and possibly greater implantation energy which will maximize so-called implant damage. If the etch rate is done after annealing, greater differential etch rate will be achieved with more chemically active species or ions, such as species which contain fluorine if a HF etchant is employed.

Figure 10:
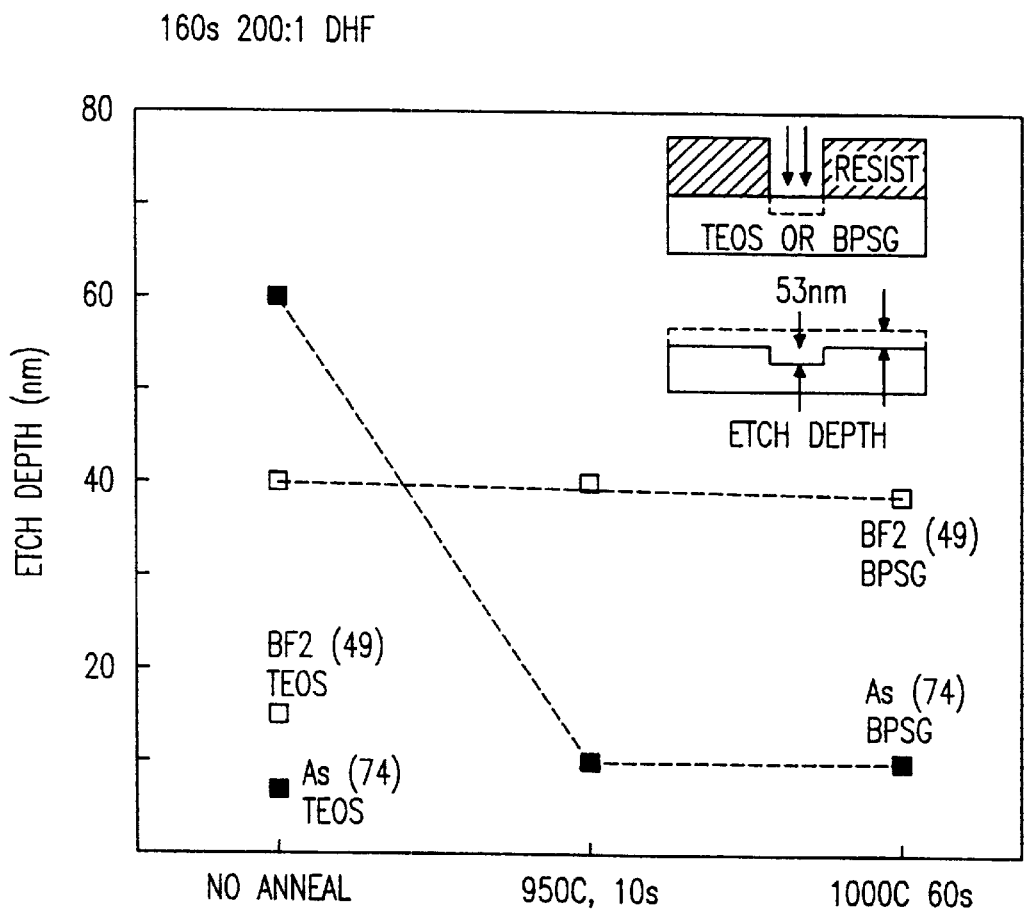

That is, if implant damage is partially or wholly relieved or corrected by annealing, the chemical reaction will dominate the etching process but, if not, the implantation damage will dominate the etching mechanism. Exemplary etch depths achieved in BPSG and TEOS with different preferred implants and anneal times and temperatures for an etch time of 160 seconds is shown in FIG. 10. As can be readily discerned therefrom, implantation of a chemically active species complementary to the etchant is substantially insensitive to annealing while implantation of a heavier species such as arsenic achieves a greater etch rate if there is no annealling but a much lower etch rate after only a relatively short annealing process (after which the etch rate does not significantly change).

As before, the connections are completed by deposition of metal and planarization as shown in FIG. 9, which again fills contact apertures 32 and results in connections of two thicknesses (e.g. 48 and 60, 62 in the same metal layer. It is thus seen from a comparison of FIG. 9 and FIG. 6, described above, that the same structure may be achieved by either dry etch or wet etch processes, each providing differing degrees of process latitude and control.

In view of the foregoing, it is seen that the invention provides simplified methodologies for developing connections of differing thicknesses in the same metallization layer; requiring only an additional etching step, block-out masking which may be required, with slight modification, by a contact implantation process and, if required by the chosen etchant or etching process, an etch stop layer. The damascene process performed for recesses or troughs of differing depth provided by the invention without masks requiring high accuracy of registration provides robust connections of dimensions which may be optimized for the array and support sections, respectively, to enhance noise immunity and signal propagation speed of an arbitrary integrated circuit design and is particularly adapted to the manufacture of dynamic random access memories of high capacity at high manufacturing yields.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of fabricating an integrated circuit device having a first functional region and a second functional region, said method including the steps of selectively etching areas of an insulator structure to form recesses therein, providing for differential etching of selected areas of said insulator structure corresponding to said recesses, block-out masking one of said first functional region and aid second functional region of said integrated circuit device, forming an aperture through said insulator structure in a recess formed by said electively etching step, differentially etching an area of said insulator structure to increase the depth of a recess to form a recess of increased depth therein in registration with recesses in said insulator structure formed by said selectively etching step, and applying metal in said recesses, and said recesses of increased depth in said insulator structure whereby metal deposits of differing thicknesses are formed in said recesses and said recess of increased depth.

2. A method as recited in claim 1, wherein said insulator structure is formed of first and second insulator layers.

3. A method as recited in claim 2, wherein said selectively etching step forms recesses in said first insulator layer and said differentially etching step forms recesses in said second insulator layer.

4. A method as recited in claim 1, wherein said step of providing for differential etching includes the step of applying an etch stop over said insulator structure.

5. A method as recited in claim 1, wherein said step of providing for differential etching includes the step of implanting an impurity in said areas of said insulator structure.

6. A method as recited in claim 3, wherein said step of providing for differential etching includes the step of applying an etch stop over said first insulator layer.

7. A method as recited in claim 3, wherein said step of providing for differential etching includes the step of implanting an impurity in said areas of said second insulator layer.

8. A method as recited in claim 1, wherein said differentially etching step is a dry etch process.

9. A method as recited in claim 8, wherein said dry etch process is a reactive ion etch.

10. A method as recited in claim 1, wherein said differentially etching step is a wet etch process.

11. A method as recited in claim 10, wherein said wet etch process is a hydrofluoric acid etch.

12. A method as recited in claim 11, wherein said step of providing for differential etching includes the step of implanting a dopant in said areas of said insulator structure.

13. A method as recited in claim 9, wherein said step of providing for differential etching includes the step of applying an etch stop over said first insulator layer.

14. A method as recited in claim 5, including the further step of annealing said insulator structure following said step of implanting an impurity and said differentially etching step.

15. A method as recited in claim 12, including the further step of annealing said insulator structure following said step of implanting an impurity and said differentially etching step.

16. A method as recited in claim 12, wherein said dopant includes $BF_2$.

17. A method as recited in claim 12, wherein said dopant includes arsenic.

* * * * *

UNITED STATES PATENT AND TRADEMARK OFFICE
CERTIFICATE OF CORRECTION

PATENT NO. : 6,136,686
DATED : October 24, 2000
INVENTOR(S) : Jeffrey P. Gambino, et. al.

It is certified that error appears in the above-identified patent and that said Letters Patent is hereby corrected as shown below:

In claim 1, line 9 (column 7, line 54), "aid second functional region" has been changed to --said second functional region--.
In claim 1, line 12 (column 7, line 57), "electively etching step" has been changed to --selectively etching step--.

Signed and Sealed this

First Day of May, 2001

Attest:

NICHOLAS P. GODICI

*Attesting Officer*          *Acting Director of the United States Patent and Trademark Office*